(12) United States Patent
Byun et al.

(10) Patent No.: US 7,288,967 B2
(45) Date of Patent: Oct. 30, 2007

(54) DIFFERENTIAL OUTPUT DRIVER AND SEMICONDUCTOR DEVICE HAVING THE SAME

(75) Inventors: Gyung-Su Byun, Seoul (KR); Il-Man Bae, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 82 days.

(21) Appl. No.: 11/337,096

(22) Filed: Jan. 19, 2006

(65) Prior Publication Data

US 2006/0214689 A1  Sep. 28, 2006

(30) Foreign Application Priority Data

Jan. 19, 2005 (KR) .................. 10-2005-0005149

(51) Int. Cl.
*H03K 19/0175* (2006.01)
*H03K 19/094* (2006.01)
(52) U.S. Cl. ............................ 326/83; 326/68; 326/86; 326/87; 327/108; 327/109; 327/333
(58) Field of Classification Search ............... 326/868, 326/83, 87; 327/109
See application file for complete search history.

(56) References Cited

U.S. PATENT DOCUMENTS 6,225,863 B1 * 5/2001 Miwa .............................. 330/9

| 6,333,639 B1 | 12/2001 | Lee |
| 6,388,521 B1 | 5/2002 | Henry |
| 6,504,397 B1 | 1/2003 | Hart et al. |
| 6,807,118 B2 * | 10/2004 | Perner .................. 365/209 |

FOREIGN PATENT DOCUMENTS

KR  2004-0062342  7/2004

OTHER PUBLICATIONS

English language abstract of Korean Publication No. 2004-0062342, Feb. 1, 2003 Publ Jul. 7, 2004.

* cited by examiner

*Primary Examiner*—Rexford Barnie
*Assistant Examiner*—Crystal L Hammond
(74) *Attorney, Agent, or Firm*—Marger Johnson & McCollom, P.C.

(57) ABSTRACT

An embodiment of a differential output driver includes a driver to generate an inverted output signal in response to an input signal and a first control signal, and to further generate an output signal in response to an inverted input signal and a second control signal. The differential output driver also includes a controller to generate the first control signal and the second control signal in response to detecting a voltage difference between a first detected voltage difference between a reference voltage and the output signal, and a second detected voltage difference between the reference voltage and the inverted output signal.

36 Claims, 7 Drawing Sheets

US 7,288,967 B2

DIFFERENTIAL OUTPUT DRIVER AND SEMICONDUCTOR DEVICE HAVING THE SAME

CROSS-REFERENCE TO RELATED APPLICATION

This application claims the benefit of Korean Patent Application No. 10-2005-0005149, filed Jan. 19, 2005, the disclosure of which is hereby incorporated herein by reference in its entirety.

BACKGROUND OF THE INVENTION

1. Field of the Invention

The present invention relates to an output driver, and more particularly, to a differential output driver and a semiconductor device having the same, in which a differential input signal is received and a differential output signal is generated.

2. Description of the Related Art

A differential output driver of a conventional semiconductor device receives a differential input signal and generates an output signal and an inverted output signal which have a voltage difference within a constant range. However, values of elements constituting the differential output driver vary due to changes in process, voltage, or temperature, resulting in the output signal and the inverted output signal having a voltage difference outside of a desired range.

FIG. 1 is a circuit diagram of an example of the conventional differential output driver, which includes PMOS transistors P1 and P2, termination resistors RT1 and RT2, NMOS transistors N1 and N2, and a bias current source Ibias.

The circuit shown in FIG. 1 operates as follows:

When an on-die termination control signal ODTEN of "low" level is applied, the PMOS transistors P1 and P2 are turned on so that the termination resistors RT1 and RT2 are connected between a power supply voltage VDD and differential output nodes n1 and n2. In this case, when differential input signals DIN and DINB of "high" level and "low" level are applied, the NMOS transistor N1 is turned on and the NMOS transistor N2 is turned off. Accordingly, an inverted output signal DQB of "low" level and an output signal DQ of "high" level are generated. In contrast, when differential input signals DIN and DINB of "low" level and "high" level, respectively, are applied, the NMOS transistor N1 is turned off and the NMOS transistor N2 is turned on. Accordingly, an inverted output signal DQB of "high" level and an output signal DQ of "low" level are generated. The termination resistors RT1 and RT2 serve to prevent the differential output signals DQ and DQB from being reflected when the differential output driver outputs the differential output signals DQ and DQB.

When the on-die termination control signal ODTEN of "high" level is applied, all of the PMOS transistors P1 and P2 are turned off, so that the termination resistors RT1 and RT2 are not connected to the power supply voltage and the differential output driver is disabled.

However, in the differential output driver shown in FIG. 1, values of the termination resistors RT1 and RT2 and other elements may vary due to changes in process, voltage, or temperature, or a swing width of the output signal DQ may differ from a swing width of the inverted output signal DQB due to a mismatch in load on a signal line transmitting the pair of differential output signals DQ and DQB. Consequently, the signal width of the pair of different output signals DQ and DQB becomes narrower, which degrades signal characteristics.

SUMMARY OF THE INVENTION

An embodiment of the invention provides a differential output driver capable of improving signal characteristics of a pair of differential output signals by reducing a swing width difference between an output signal and an inverted output signal even when values of elements are changed according to a change in process, voltage, or temperature.

This embodiment includes a driver including a differential output portion including first and second on-die termination resistors connected to an inverted output signal generation terminal and an output signal generation terminal, respectively, to terminate an inverted output signal and an output signal. The driver also includes a first driver connected to the inverted output signal generation terminal to generate the inverted output signal in response to an input signal, and a second driver connected to the output signal generation terminal to generate the output signal in response to an inverted input signal. An inverted output signal drive variable portion is further connected in parallel to the first driver to vary the driving capabilities of the first driver in response to a first control signal, and an output signal drive variable portion is connected in parallel to the second driver to vary the driving capabilities of the second driver in response to a second control signal. Also included is a controller for detecting voltage differences between a reference voltage and each of the inverted output signal and the output signal, detecting a voltage difference between the voltage differences to generate an average error value, and generating the first and second control signals in response to the average error value.

BRIEF DESCRIPTION OF THE DRAWINGS

The foregoing and other objects, features and advantages of the invention will be apparent from the detailed description of embodiments of the invention, as illustrated in the accompanying drawing. The drawings, however, are not necessarily to scale; rather emphasis has been placed on illustrating the principles of the invention.

DETAILED DESCRIPTION OF THE INVENTION

Hereinafter, a differential output driver and a semiconductor device having the same will be described with reference to the accompanying drawings.

Figure 2:
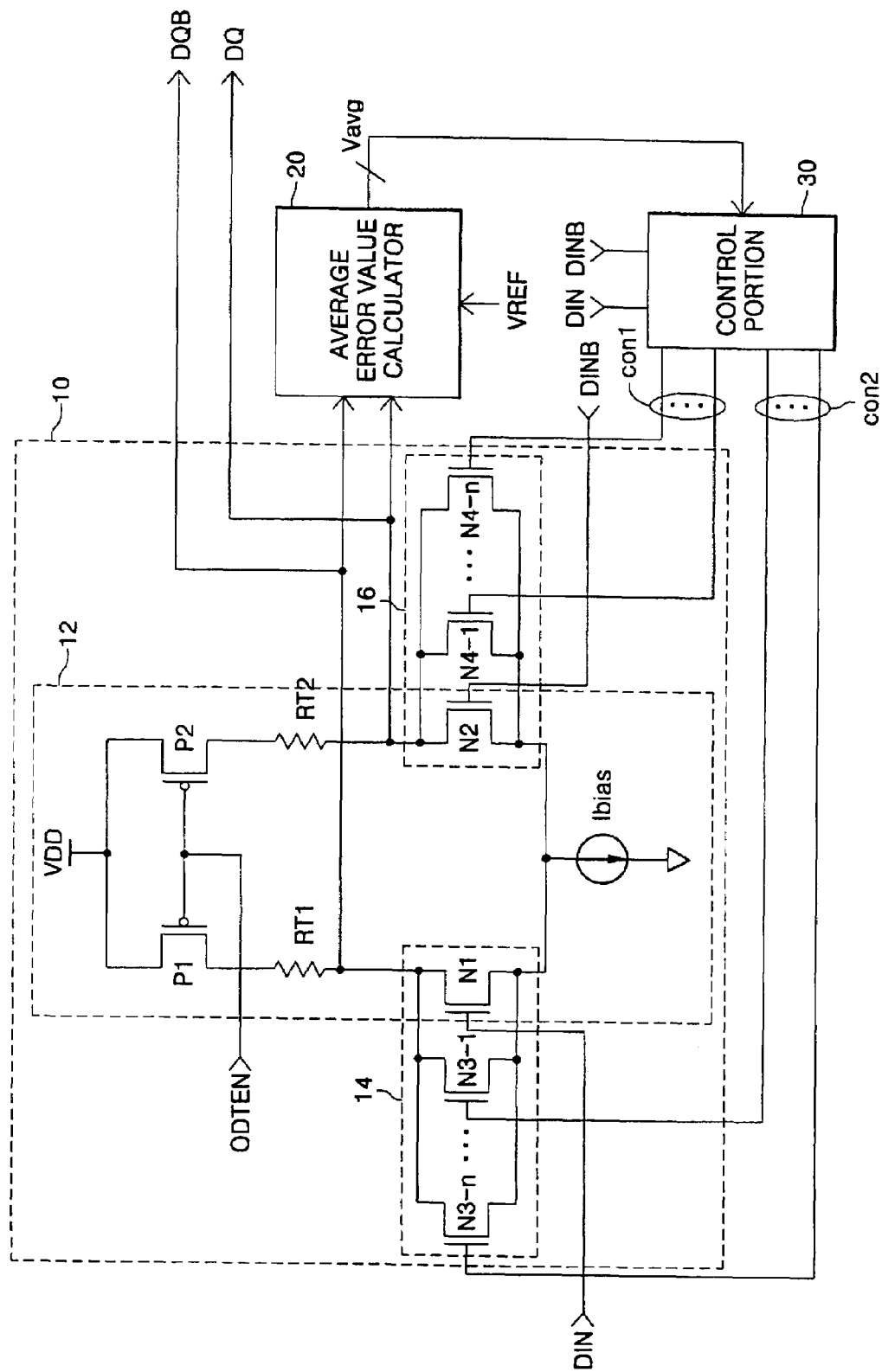
FIG. 2 is a diagram illustrating the structure of a differential output driver in accordance with an embodiment of the present invention.

FIG. 2 is a diagram illustrating the structure of a differential output driver in accordance with an embodiment of the present invention. The embodiment illustrated in FIG. 2 includes a driver 10, an average error value calculator 20, and a control portion 30. The driver 10 has a differential output portion 12, an inverted output signal drive variable portion 14, and an output signal drive variable portion 16. The differential output portion 12 includes PMOS transistors P1 and P2, termination resistors RT1 and RT2, and NMOS transistors N1 and N2. The inverted output signal drive variable portion 14 is composed of NMOS transistors N3-1 to N3-n. The output signal drive variable portion 16 is composed of NMOS transistors N4-1 to N4-n.

The function of the differential output driver shown in FIG. 2 is now described below.

Figure 1:
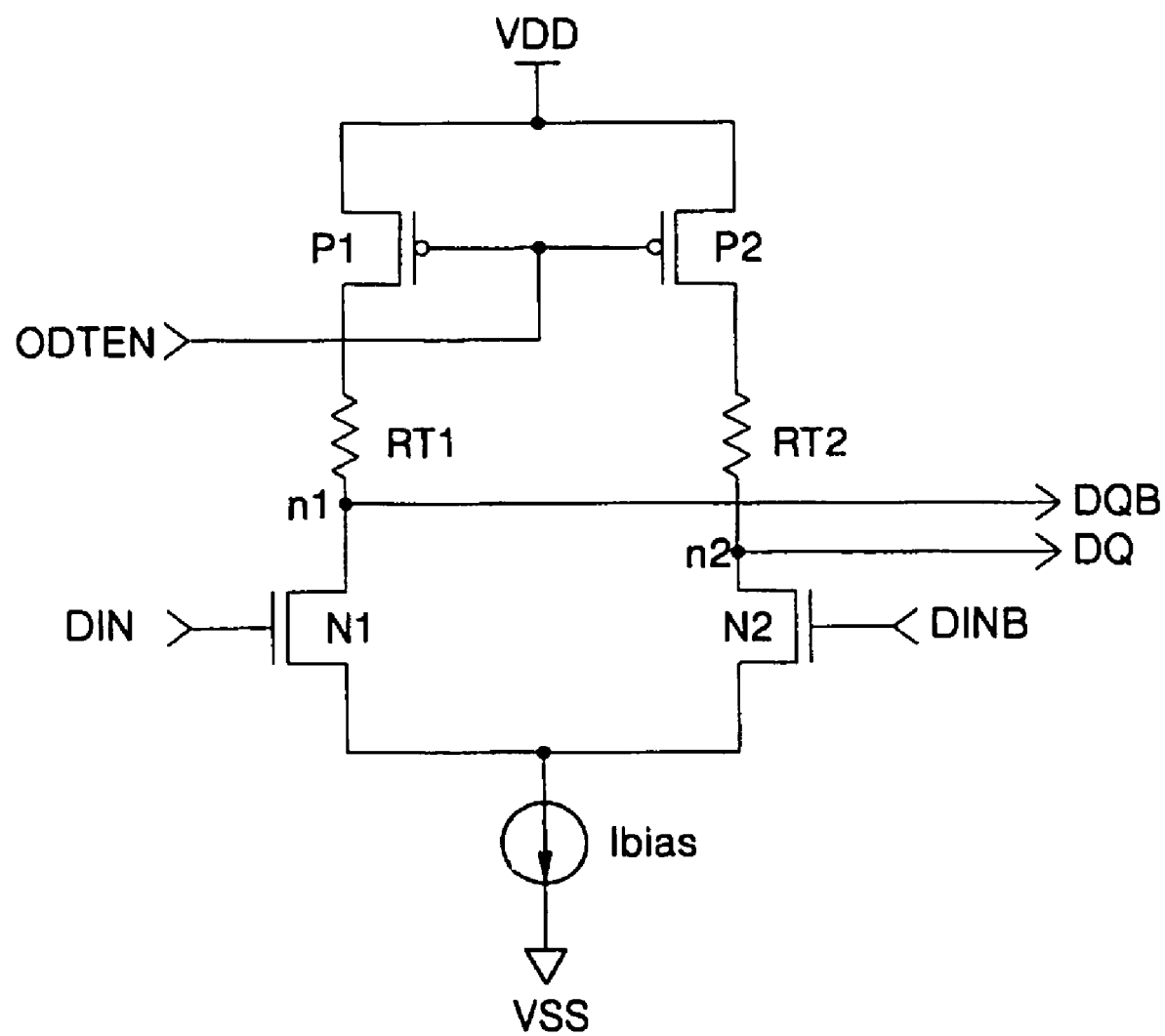
FIG. 1 is a circuit diagram of an example of a conventional differential output driver.

The function of the differential output portion 12 can be understood with reference to the description related to the function of the conventional differential output driver shown in FIG. 1. The inverted output signal drive variable portion 14 varies the driving capability of the NMOS transistors N3-1 to N3-n in response to a control signal con2 to vary a swing width of an inverted output signal DQB. The output signal drive variable portion 16 varies the driving capability of the NMOS transistors N4-1 to N4-n in response to a control signal con1 to vary a swing width of an output signal DQ.

The average error value calculator 20 detects a voltage difference corresponding to swing widths between a reference voltage VREF and the inverted differential output signal DQB, and between the reference voltage VREF and the differential output signal DQ. The average error value calculator 20 then calculates an average value of these voltage differences to generate an output signal Vavg. The control portion 30 converts the output signal Vavg from an analog signal into a digital signal, and generates the control signals con1 and con2 in response to Vavg. For example, when the swing width of the inverted output signal DQB is smaller than that of the output signal DQ, the number of bits having a "high" level in the control signal con2 is increased so as to increase the number of NMOS transistors N3-1 to N3-n that are turned on in response to the control signal con2. Further, the number of bits having a "high" level in the control signal con1 is decreased so as to decrease the number of NMOS transistors N4-1 to N4-n that are turned on in response to the control signal con1. In contrast, when the swing width of the output signal DQ is smaller than that of the inverted output signal DQB, the number of bits having a "high" level in the control signal con1 is increased so as to increase the number of NMOS transistors N4-1 to N4-n that are turned on in response to the control signal con1. And the number of bits having a "high" level in the control signal con2 is decreased so as to decrease the number of NMOS transistors N3-1 to N3-n that are turned on in response to the control signal con2. When the swing width of the inverted output signal DQB is substantially equal to the swing width of the output signal DQ, the operation of varying the control signals con1 and con2 is stopped.

Figure 3A:
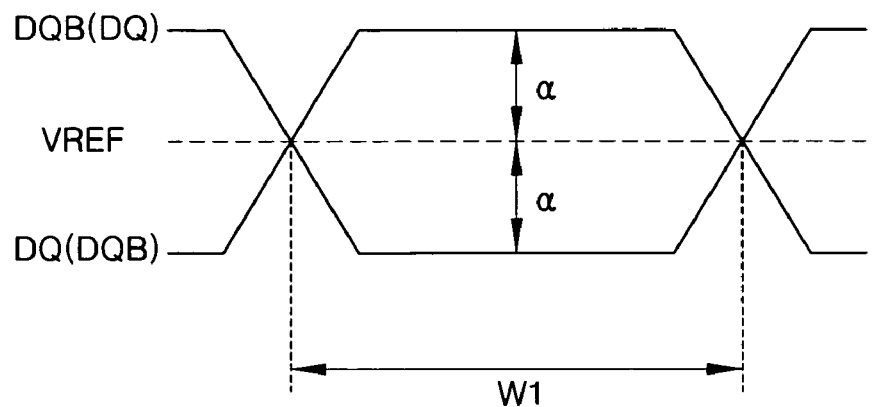
FIG. 3A to 3C are diagrams illustrating a pair of differential output signals output from a differential output driver in accordance with an embodiment of the present invention.
Figure 3B:
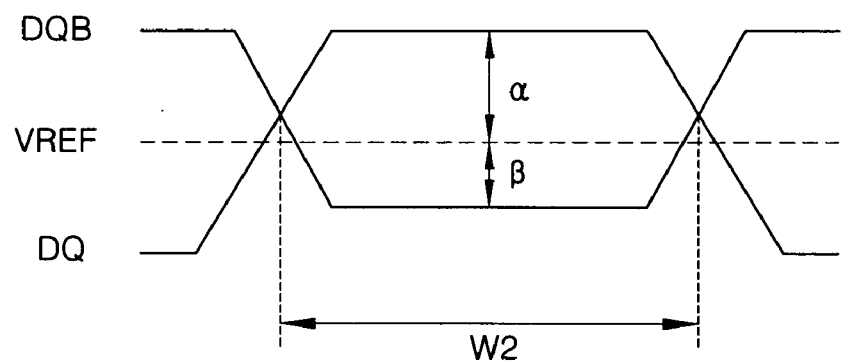
Figure 3C:
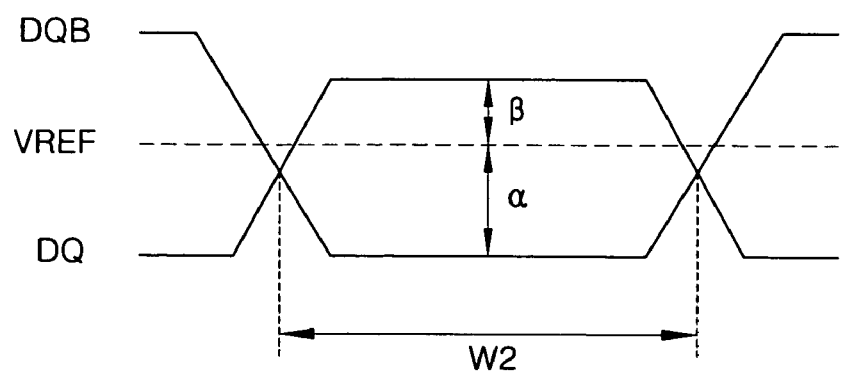

FIG. 3A to 3C are diagrams illustrating a pair of differential output signals DQB and DQ output from a differential output driver in accordance with an embodiment of the present invention. The function of the differential output driver of the present invention will now be described with reference to FIG. 3A to 3C.

FIG. 3A shows a pair of normal differential output signals DQB and DQ, in which the reference voltage VREF has a constant voltage difference a from the inverted output signal DQB and also from the output signal DQ. In this case, the signal widths of the pair of differential output signals DQB and DQ are W1.

FIG. 3B shows a pair of erroneous differential output signals DQB and DQ. Here, the voltage difference between the inverted output signal DQB and the reference voltage VREF is β, while the voltage difference between the output signal DQ and the reference voltage VREF is α, which is larger than β. In this case, a signal width of the pair of different output signals DQB and DQ becomes W2, which is smaller than W1. The larger the signal width becomes, the better the signal characteristics become. Thus, the signal characteristics are better in FIG. 3A than in FIG. 3B.

When the pair of differential output signals DQB and DQ are skewed from a desired position as shown in FIG. 3B, the number of bits having a "high" level in the control signal con2 is increased so as to increase the number of NMOS transistors N3-1 to N3-n that are turned on in response to the control signal con2, whereas the number of bits having a "high" level in the control signal con1 is decreased so as to decrease the number of NMOS transistors N4-1 to N4-n that are turned oil in response to the control signal con1. Accordingly, the swing width corresponding to the voltage difference between the inverted output signals DQB and the reference voltage VREF becomes equalized to the swing width corresponding to a voltage difference between the output signals DQ and the reference voltage VREF. Consequently, the signal widths of the pair of differential output signals DQB and DQ become larger, e.g., from W2 to W1, which improves the signal characteristics.

FIG. 3C shows a pair of erroneous differential output signals DQB and DQ. Here, the voltage difference between the output signal DQ and the reference voltage VREF is β, and a voltage difference between the inverted output signal DQB and the reference voltage VREF is α, which is larger than β. Similarly to FIG. 3B, the signal widths of the pair of differential output signals DQB and DQ become W2, which is smaller than W1. Accordingly, the signal characteristics are better in FIG. 3A than in FIG. 3C.

When the pair of differential output signals DQB and DQ are skewed from a desired position as shown in FIG. 3C, the number of bits having a "high" level of the control signal con1 is increased so as to increase the number of NMOS transistors N4-1 to N4-n that are turned on in response to the control signal con1, whereas the number of bits having a "high" level of the control signal con2 is decreased so as to decrease the number of NMOS transistors N3-1 to N3-n that are turned on in response to the control signal con2. Accordingly, the swing width corresponding to the voltage difference between the inverted output signals DQB and the reference voltage VREF becomes equalized to the swing width corresponding to a voltage difference between the output signals DQ and the reference voltage VREF. Consequently, the signal widths of the pair of differential output signals DQB and DQ become larger, e.g., from W2 to W1, which improves the signal characteristics.

Referring again to FIGS. 3B and 3C, it can be seen that the signal widths of the pair of erroneous differential output signals DQB and DQ are W2 which is narrower than the signal width W1 in FIG. 3A. However, as discussed above, adjusting the number of NMOS transistors N3-1 to N3-n or NMOS transistors N4-1 to N4-n that are turned on can decrease the difference between the reference voltage VREF and inverted output signal DQB voltage difference and the reference voltage VREF and output signal DQ voltage difference, which in turn increases the signal width and improves the signal characteristics.

Figure 4:
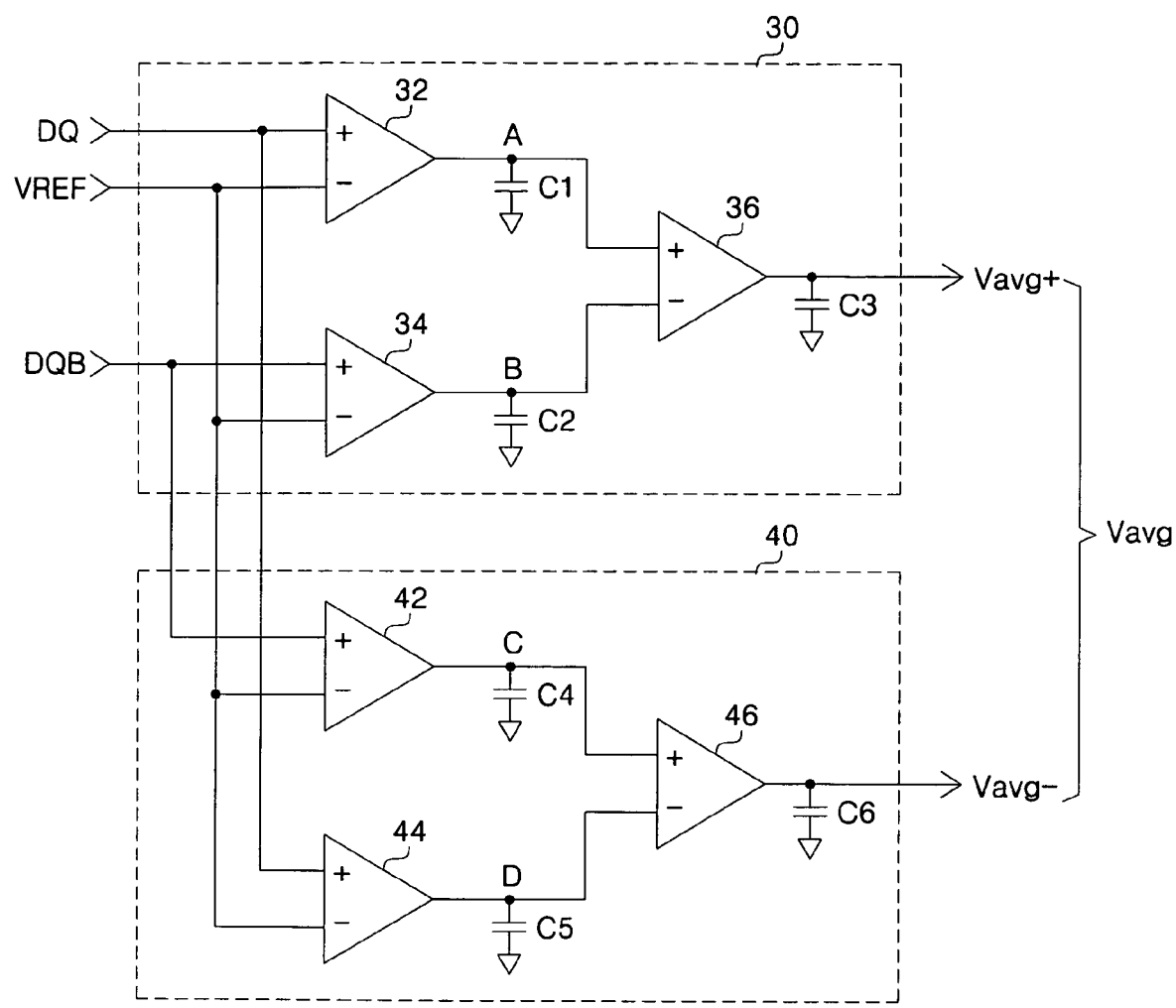
FIG. 4 is a block diagram of an average error value calculator shown in FIG. 2.

FIG. 4 is a block diagram of an example of the average error value calculator shown in FIG. 2, which is composed of a first average error value calculator 30 and a second average error value calculator 40. The first average error value calculator 30 has differential amplifiers 32, 34, and 36, and capacitors C1, C2, and C3, and the second average error value calculator 40 has differential amplifiers 42, 44, and 46, and capacitors C4, C5, and C6.

The function of each of the blocks shown in FIG. 4 will now be described below.

Each of the differential amplifiers 32 and 44 detects a voltage difference (α-VREF) between the output signal DQ and the reference voltage VREF, and amplifies the difference to generate signals A and D, respectively. Each of the differential amplifiers 34 and 42 detects a voltage difference (VREF-β) between the inverted output signal DQB and the reference voltage VREF, and amplifies the difference to generate signals B and C, respectively. The differential amplifier 36 detects a voltage difference ((α-β)/2) between signal A and signal B, and amplifies the difference to generate an output signal Vavg+. The differential amplifier 46 detects a voltage difference ((β-α)/2) between the signal C and the signal D, and amplifies the difference to generate an output signal Vavg-. Respective capacitors C1 to C6 accumulate charges corresponding to levels of the respective signals A, B, Vavg+, C, D, and Vavg-. Here, the output signal Vavg+ is an analog signal, which is an average value of the signal A and the signal B, and the output signal Vavg- generated is an analog signal, which is an average value of the signal C and the signal D and has an opposite phase to the output signal Vavg+.

Figure 5:
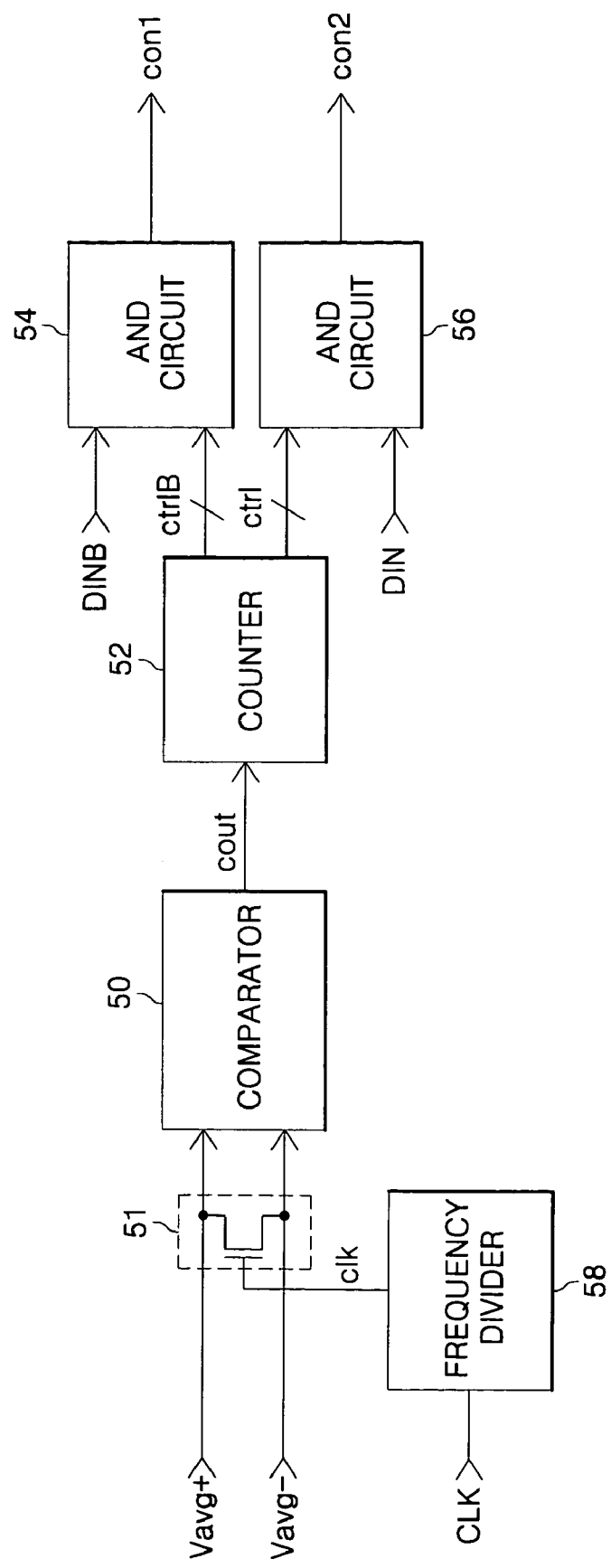
FIG. 5 is a block diagram of a control portion shown in FIG. 2.

FIG. 5 is a block diagram of the control portion shown in FIG. 2, which includes a comparator 50, an equalization circuit 51, a counter 52, AND circuits 54 and 56, and a frequency divider 58.

The function of each of the blocks shown in FIG. 5 will now be described below.

The frequency divider 58 divides a clock signal CLK of high frequency to generate a clock signal clk of low frequency. When the clock signal CLK is not a clock signal of high frequency, the frequency divider 58 may not be employed and the clock signal CLK may be applied to the equalization circuit 51. The equalization circuit 51 includes an NMOS transistor which is turned on in response to the clock signal clk having a "high" level, so that it makes output signals Vavg+ and Vavg- substantially equal to each other. The equalization circuit 51 may not be employed if it is not necessary. The comparator 50 compares the voltages of the output signals Vavg+ and Vavg-, and generates a comparison output signal cout having a "high" level when the level of the output signal Vavg+ is higher than that of the output signal Vavg-, and a comparison output signal cout having a "low" level when the level of the output signal Vavg- is higher than that of the output signal Vavg+. The counter 52 is initially set to have a code corresponding to an intermediate number of "high" level bits, and increases the number of bits having a "high" level in the control signal ctrl when the comparison output signal cout having a "high" level is generated, and decreases the number of bits having a "high" level in the control signal ctrl when the comparison output signal cout having a "low" level is generated. The number of bits having a "high" level of the inverted control signal ctrlB decreases when the number of bits having a "high" level in the control signal ctrl increases, and the number of bits having a "high" level of the inverted control signal ctrlB increases when the number of bits having a "high" level of the control signal ctrl decreases. The AND circuit 54 performs an AND operation on an inverted input signal DINB and an inverted control signal ctrlB to generate a first control signal con1, and the AND circuit 56 performs an AND operation on an input signal DIN and a control signal ctrl to generate a second control signal con2.

Figure 6A:
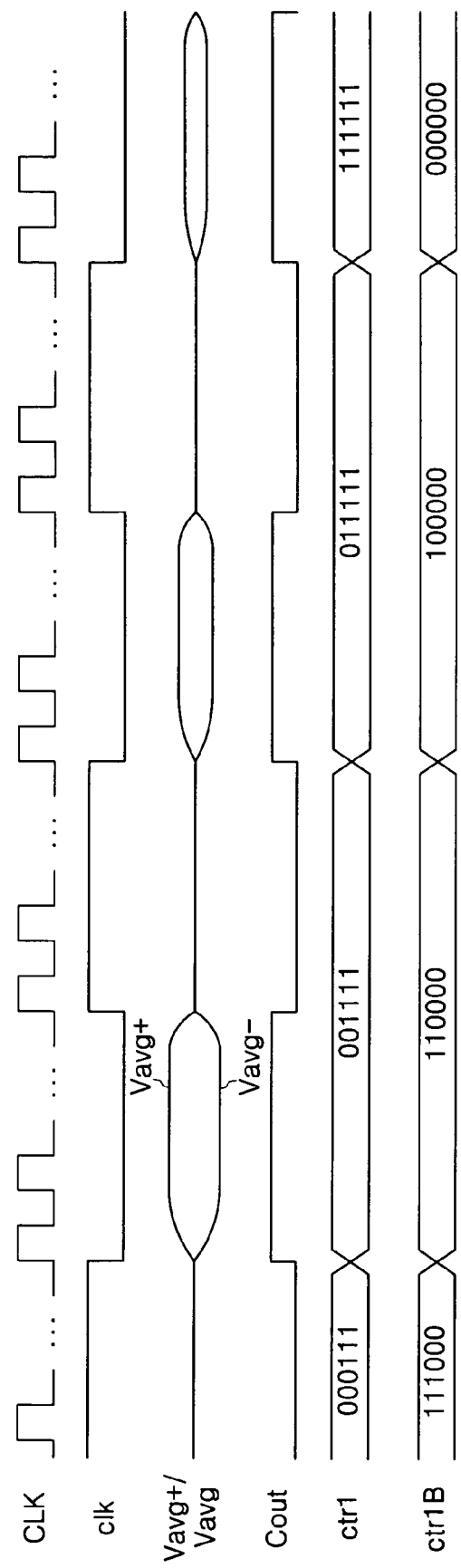
FIGS. 6A and 6B are operational timing diagrams illustrating operations of the control portion shown in FIG. 5.
Figure 6B:
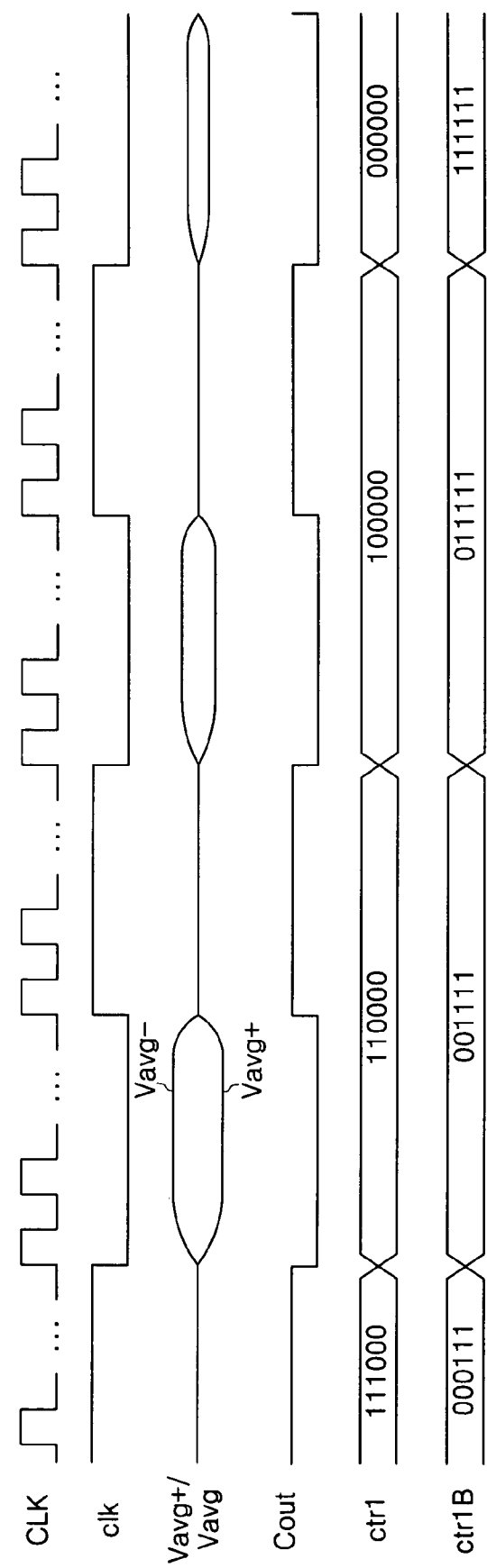

FIGS. 6A and 6B are operational timing diagrams illustrating an operation of the control portion shown in FIG. 5. FIG. 6A corresponds to the case where a pair of differential output signals DQB and DQ operate as illustrated in FIG. 3B. FIG. 6B corresponds to the case where the pair of differential output signals DQB and DQ operate as illustrated in FIG. 3C. In this embodiment, the counter 52 is a 6-bit counter, and its initial value is set to "000111." However, the counter may operate with more or less bits without departing from the spirit and scope of the present invention.

The frequency divider 58 divides a clock signal CLK to generate a clock signal clk. When the pair of differential output signals DQB and DQ are generated as shown in FIG. 3B, an output signal Vavg+ of high level and an output signal Vavg- of low level are generated as shown in FIG. 6A.

The levels of the output signals Vavg+ and Vavg- become substantially equal to each other when the NMOS transistor of the equalization circuit shown in FIG. 5 is turned on in response to the clock signal clk having a "high" level, and the output signals Vavg+ and Vavg- are applied to the comparator 50 when the NMOS transistor is turned off in response to the clock signal clk having a "low" level. The comparator 50 generates a comparison output signal cout having a "high" level because the level of the output signal Vavg+ is higher than that of the output signal Vavg-. The counter 52 counts a control signal ctrl having an initial value set to "000111" in response to the comparison output signal cout having a "high" level, and generates a control signal ctrl of "001111" and an inverted control signal ctrlB of "110000." When an inverted input signal DINB has a "high" level, the AND circuit 54 generates a control signal con1 of "110000" and the AND circuit 56 generates a control signal con2 of "000000." Accordingly, the number of NMOS transistors N4-1 to N4-6 turned on in FIG. 2 decreases so that the swing width of the output signal DQ decreases. In contrast, when the input signal DIN has a "high" level, the AND circuit 56 generates a control signal con2 of "001111" and the AND circuit 54 generates a control signal con1 of "000000." Accordingly, the number of NMOS transistors N3-1 to N3-6 turned on in FIG. 2 increases so that the swing width of the output signal DQB increases.

By repeatedly carrying out the operation as described above, a voltage difference between the output signals Vavg+ and Vavg- at the "low" level of the clock signal clk gradually decreases, so that the voltage difference between the output signals Vavg+ and Vavg- becomes substantially zero.

In contrast, when a pair of differential output signals DQB and DQ are generated as shown in FIG. 3B, the output signal Vavg- of high level and the output signal Vavg+ of low level are generated as shown in FIG. 6B.

When the NMOS transistor of the equalization circuit shown in FIG. 5 is turned on in response to the clock signal clk having a "high" level, the levels of the output signals Vavg+ and Vavg- become substantially equal to each other, and when the NMOS transistor N is turned off in response to the clock signal clk having a "low" level, the output signals Vavg+ and Vavg- are applied to the comparator 50. The comparator 50 generates a comparison output signal cout having a "low" level because the level of the output signal Vavg- is higher than that of the output signal Vavg+. The counter 52 counts a control signal ctrl having an initial value set to "000111" in response to the comparison output signal cout having a "low" level, and generates a control signal ctrl of "110000" and an inverted control signal ctrlB of "001111." When the inverted input signal DINB has a "high" level, the AND circuit 54 generates a control signal con1 of "111100" and the AND circuit 56 generates a control signal con2 of "000000." Accordingly, the number of NMOS transistors N4-1 to N4-6 turned on in FIG. 2 increases so that the swing width of the output signal DQ increases. In contrast, when the input signal DIN has a "high" level, the AND circuit 56 generates a control signal con2 of "000011" and the AND circuit 54 generates a control signal con1 of "000000." Accordingly, the number of NMOS transistors N3-1 to N3-6 turned on in FIG. 2 decreases so that the swing width of the output signal DQB decreases.

By repeatedly carrying out the operation as described above, a voltage difference between the output signals Vavg+ and Vavg− at the "low" level of the clock signal clk gradually decreases, so that a voltage difference between the output signals Vavg+ and Vavg− becomes substantially zero.

The differential output driver of the present invention may be applied to a semiconductor device, so that a pair of differential output signals having a swing width within a desired range can be generated.

Accordingly, the different output driver and the semiconductor device having the same according to the present invention can make swing widths between the inverted output signal and the output signal substantially equal to each other even when values of the elements are changed due to a change in process, voltage, or temperature, thus improving the signal characteristics.

Embodiments of the present invention have been described herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A differential output driver, comprising:
   a driver including:
      a differential output portion comprising first and second on-die termination resistors connected to an inverted output signal generation terminal and an output signal generation terminal, respectively to terminate an inverted output signal and an output signal, a first driver connected to the inverted output signal generation terminal to generate the inverted output signal in response to an input signal, and a second driver connected to the output signal generation terminal to generate the output signal in response to an inverted input signal,
      an inverted output signal drive variable portion connected in parallel to the first driver to vary a driving capability of the first driver in response to a first control signal, and
      an output signal drive variable portion connected in parallel to the second driver to vary a driving capability of the second driver in response to a second control signal; and
   a controller for detecting voltage differences between a reference voltage and each of the inverted output signal and the output signal, detecting a voltage difference between the voltage differences to generate an average error value, and generating the first and second control signals in response to the average error value.

2. The differential output driver according to claim 1, wherein the controller includes:
   an average error value generating portion for detecting voltage differences between the reference voltage and each of the inverted output signal and the output signal, and detecting a voltage difference between the voltage differences to generate the average error value having first and second average error values; and
   a control portion receiving the first and second average error values to generate the first and second control signals.

3. The differential output driver according to claim 2, wherein the average error value generating portion includes:
   a first average error value calculator for detecting voltage differences between the reference voltage and each of the inverted output signal and the output signal, and detecting a voltage difference between the voltage differences to generate the first average error value; and
   a second average error value calculator for detecting voltage differences between the reference voltage and each of the inverted output signal and the output signal, and detecting a voltage difference between the voltage differences to generate the second average error value having an opposite phase to the first average error value.

4. The differential output driver according to claim 3, wherein the first average error value calculator includes:
   a first differential amplifier for detecting a voltage difference between the reference voltage and the output signal and generating a first signal;
   a second differential amplifier for detecting a voltage difference between the reference voltage and the inverted output signal and generating a second signal; and
   a third differential amplifier for detecting a voltage difference between the first signal and the second signal and generating the first average error value.

5. The differential output driver according to claim 3, wherein the second average error value calculator includes:
   a fourth differential amplifier for detecting a voltage difference between the reference voltage and the inverted output signal and generating a third signal;
   a fifth differential amplifier for detecting a voltage difference between the reference voltage and the output signal and generating a fourth signal; and
   a sixth differential amplifier for detecting a voltage difference between the third signal and the fourth signal and generating the second average error value.

6. The differential output driver according to claim 2, wherein the first control signal includes first predetermined data bits, and the inverted output signal drive variable portion has a plurality of first NMQS transistors connected in parallel to each other and each data bit of the first predetermined data bits is applied to each of the first NMOS transistors.

7. The differential output driver according to claim 6, wherein the second control signal includes second predetermined data bits, and the output signal drive variable portion has a plurality of second NMOS transistors connected in parallel to each other and each data bit of the second predetermined data bits is applied to each of the second NMOS transistors.

8. The differential output driver according to claim 7, wherein the control portion includes:
   a comparator for comparing the first average error value and the second average error value and generating a comparison output signal;

a counter for generating fifth and sixth signals in response to the comparison output signal, increasing the number of bits having a "high" level of the fifth signal in response to a first state of the comparison output signal, and decreasing the number of bits having a "high" level of the sixth signal in response to a second state of the comparison output signal, the sixth signal being an inverted signal of the fifth signal; and a control signal generating portion for generating the first control signal in response to the fifth signal and the input signal, and generating the second control signal in response to the sixth signal and the inverted input signal.

9. The differential output driver according to claim 8, wherein the control portion further includes:

a frequency divider for dividing a clock signal of high frequency to generate a clock signal of low frequency; and an equalization circuit for making the first average error value substantially equal to the second average error value in response to the clock signal of low frequency.

10. The differential output driver according to claim 9, wherein the control signal generating portion includes:

a first AND circuit for performing an AND operation on the fifth signal and the input signal to generate the first control signal; and a second AND circuit for performing an AND operation on the sixth signal and the inverted input signal to generate the second control signal.

11. A semiconductor device having a plurality of differential output drivers which generate a plurality of differential output signal pairs, each pair including an inverted output signal and an output signal, each differential output driver comprising:

a driver including a differential output portion including first and second on-die termination resistors connected to an inverted output signal generation terminal and an output signal generation terminal, respectively, to terminate the inverted output signal and the output signal, a first driver connected to the inverted output signal generation terminal to generate the inverted output signal in response to an input signal, and a second driver connected to the output signal generation terminal to generate the output signal in response to an inverted input signal, an inverted output signal drive variable portion connected in parallel to the first driver to vary a driving capability of the first driver in response to a first control signal, and an output signal drive variable portion connected in parallel to the second driver to vary a driving capability of the second driver in response to a second control signal, wherein the plurality of differential output drivers include at least one controller for detecting voltage differences between a reference voltage and each of the inverted output signal and the output signal, detecting a voltage difference between the voltage differences to generate an average error value, and generating the first and second control signals in response to the average error value.

12. The semiconductor device according to claim 11, wherein the controller includes:

an average error value generating portion for detecting voltage differences between the reference voltage and each of the inverted output signal and the output signal, and detecting a voltage difference between the voltage differences to generate the average error value having first and second average error values; and a control portion receiving the first and second average error values to generate the first and second control signals.

13. The semiconductor device according to claim 12, wherein the average error value generating portion includes:

a first average error value calculator for detecting voltage differences between the reference voltage and each of the inverted output signal and the output signal, and detecting a voltage difference between the voltage differences to generate the first average error value; and a second average error value calculator for detecting voltage differences between the reference voltage and each of the inverted output signal and the output signal, and detecting a voltage difference between the voltage differences to generate the second average error value of an opposite phase to the first average error value.

14. The semiconductor device according to claim 13, wherein the first average error value calculator includes:

a first differential amplifier for detecting a voltage difference between the reference voltage and the output signal and generating a first signal;

a second differential amplifier for detecting a voltage difference between the reference voltage and the inverted output signal and generating a second signal; and a third differential amplifier for detecting a voltage difference between the first signal and the second signal and generating the first average error value.

15. The semiconductor device according to claim 13, wherein the second average error value calculator includes:

a fourth differential amplifier for detecting a voltage difference between the reference voltage and the inverted output signal and generating a third signal;

a fifth differential amplifier for detecting a voltage difference between the reference voltage and the output signal and generating a fourth signal; and a sixth differential amplifier for detecting a voltage difference between the third signal and the fourth signal and generating the second average error value.

16. The semiconductor device according to claim 12, wherein the first control signal includes first predetermined data bits, and the inverted output signal drive variable portion includes a plurality of first NMOS transistors connected in parallel to each other and each data bit of the first predetermined data bits is applied to each of the first NMOS transistors.

17. The semiconductor device according to claim 16, wherein the second control signal includes second predetermined data bits, and the output signal drive variable portion includes a plurality of second NMOS transistors connected in parallel to each other and each data bit of the second predetermined data bits is applied to each of the second NMOS transistors.

18. The semiconductor device according to claim 17, wherein the control portion includes:

a comparator for comparing the first average error value and the second average error value to generate a comparison output signal;

a counter for generating fifth and sixth signals in response to the comparison output signal, increasing the number of bits having a "high" level of the fifth signal in response to a first state of the comparison output signal, and decreasing the number of bits having a "high" level of the sixth signal in response to a second state of the comparison output signal, the sixth signal being an inverted signal of the fifth signal; and a control signal generating portion for generating the first control signal in response to the fifth signal and the input signal, and generating the second control signal in response to the sixth signal and the inverted input signal.

19. The semiconductor device according to claim 18, wherein the control portion further includes:
a frequency divider for dividing a clock signal of high frequency to generate a clock signal of low frequency; and
an equalization circuit for making the first average error value substantially equal to the second average error value in response to the clock signal of low frequency.

20. The semiconductor device according to claim 19, wherein the control signal generating portion includes:
a first AND circuit for performing an AND operation on the fifth signal and the input signal to generate the first control signal; and
a second AND circuit for performing an AND operation on the sixth signal and the inverted input signal to generate the second control signal.

21. A differential output driver, comprising:
a driver to generate an inverted output signal in response to an input signal and a first control signal, and to further generate an output signal in response to an inverted input signal and a second control signal; and
a controller to generate the first control signal and the second control signal in response to detecting a voltage difference between a first detected voltage difference between a reference voltage and the output signal and a second detected voltage difference between the reference voltage and the inverted output signal.

22. The differential output driver of claim 21, wherein the driver further comprises:
a first variable driver to drive the inverted output signal in response to the input signal and the first control signal; and
a second variable driver to drive the output signal in response to the inverted input signal and the second control signal.

23. The differential output driver of claim 22, wherein the controller comprises:
an average error value generating unit to generate a first and a second average error value in response to the detected voltage difference between the respective voltage differences between the reference voltage and each of the inverted output signal and output signal; and
a control unit to generate the first and second control signal in response to the first and second average error value, respectively.

24. The differential output driver of claim 23, wherein the average error value generating unit comprises:
a first average error value calculator to generate the first average error value in response to the detected voltage difference between the respective voltage differences between the reference voltage and each of the inverted output signal and the output signal; and
a second average error value calculator to generate the second average error value in response to the detected voltage difference between the respective voltage differences between the reference voltage and each of the inverted output signal and the output signal.

25. The differential output driver according to claim 24, wherein the first average error value calculator comprises:
a first differential amplifier for detecting a voltage difference between the reference voltage and the output signal and generating a first signal;
a second differential amplifier for detecting a voltage difference between the reference voltage and the inverted output signal and generating a second signal; and
a third differential amplifier for detecting a voltage difference between the first signal and the second signal and generating the first average error value.

26. The differential output driver according to claim 24, wherein the second average error value calculator includes:
a fourth differential amplifier for detecting a voltage difference between the reference voltage and the inverted output signal and generating a third signal;
a fifth differential amplifier for detecting a voltage difference between the reference voltage and the output signal and generating a fourth signal; and
a sixth differential amplifier for detecting a voltage difference between the third signal and the fourth signal and generating the second average error value.

27. The differential output driver according to claim 23, wherein the first variable signal driver includes a plurality of first NMOS transistors connected in parallel to each other and the second variable signal driver includes a plurality of second NMOS transistors connected in parallel to each other.

28. The output driver according to claim 27, wherein the first control signal includes a plurality of logic bits applied to the plurality of first NMOS transistors, each logic bit being applied to each of the respective first NMOS transistors, and wherein the second control signal includes a plurality of logic bits applied to the plurality of second NMOS transistors, each logic bit being applied to each of the respective second NMOS transistors.

29. The differential output driver according to claim 28, wherein the control unit comprises:
a comparator for comparing the first average error value and the second average error value and generating a comparison output signal;
a counter for generating fifth and sixth signals in response to the comparison output signal, increasing the number of logic bits having a "high" level of the fifth signal in response to a first state of the comparison output signal, and decreasing the number of logic bits having a "high" level of the sixth signal in response to a second state of the comparison output signal, the sixth signal being an inverted signal of the fifth signal; and
a control signal generator for generating the first control signal in response to the fifth signal and the input signal, and generating the second control signal in response to the sixth signal and the inverted input signal.

30. The differential output driver according to claim 29, wherein the control unit further includes:
a frequency divider for dividing a clock signal of high frequency to generate a clock signal of low frequency; and
an equalization circuit for making the first average error value substantially equal to the second average error value in response to the clock signal of low frequency.

31. The differential output driver according to claim 30, wherein the control signal generator comprises:
a first AND circuit for performing an AND operation on the fifth signal and the input signal to generate the first control signal; and
a second AND circuit for performing an AND operation on the sixth signal and the inverted input signal to generate the second control signal.

32. A method of driving a plurality of differential output signals comprising:
- generating a first output signal in response to a first input signal and a first control signal;
- generating a second output signal in response to a second input signal and a second control signal;
- detecting a first voltage difference between a reference voltage and the first output signal;
- detecting a second voltage difference between the reference voltage and the second output signal;
- detecting a third voltage difference between the first voltage difference and the second voltage difference; and
- generating the first control signal and the second control signal in response to the third detected voltage difference.

33. The method of claim 32, wherein the first control signal includes a plurality of logic bits and the second control signal includes a plurality of logic bits.

34. The method of claim 33, further comprising:
- generating a first and second avenge error value in response to the third detected voltage difference; and
- generating the first and second control signal in response to the first and second average error value, respectively.

35. The method of claim 34, further comprising:
- dividing a clock signal of high frequency to generate a clock signal of low frequency; and
- substantially equalizing the first average error value to the second average error value in response to the clock signal of low frequency.

36. The method of claim 32, further comprising:
- comparing the first average error value with the second average error value;
- generating a comparison output signal in response to the average error value comparison;
- generating a first and second signal in response to the comparison output signal, wherein the number of logic bits in the first signal having a "high" level is increased in response to a first state of the comparison output signal, and wherein the number of logic bits in the second signal having a "high" level is decreased in response to a second state of the comparison output signal; and
- generating the first control signal in response to the first signal and the first input signal and generating the second control signal in response to the second signal and the second input signal.

* * * * *

UNITED STATES PATENT AND TRADEMARK OFFICE
CERTIFICATE OF CORRECTION

PATENT NO. : 7,288,967 B2  Page 1 of 1
APPLICATION NO. : 11/337096
DATED : October 30, 2007
INVENTOR(S) : Gyung-Su Byun et al.

It is certified that error appears in the above-identified patent and that said Letters Patent is hereby corrected as shown below:

Column 3, line 64, the word "a" should read -- $\alpha$ --;
Column 4, line 19, the word "oil" should read -- on --;
Column 8, line 52, the word "NMQS" should read -- NMOS --;
Column 13, line 21, the word "avenge" should read -- average --.

Signed and Sealed this

Sixteenth Day of September, 2008

JON W. DUDAS
*Director of the United States Patent and Trademark Office*